METHOD FOR FORMING SEMICONDUCTOR DEVICES BY MASKING AND DIFFUSION

Filed Dec. 10, 1965 2 Sheets-Sheet 1

INVENTOR.
JOSEPH H. SCOTT, JR.
BY
Glenn H. Barnette
Attorney

INVENTOR.
JOSEPH H. SCOTT, JR.
BY
Glenn H. Bruestle
Attorney

United States Patent Office 3,383,251
Patented May 14, 1968

3,383,251

METHOD FOR FORMING OF SEMICONDUCTOR DEVICES BY MASKING AND DIFFUSION

Joseph H. Scott, Jr., Newark, N.J., assignor to Radio Corporation of America, a corporation of Delaware Filed Dec. 10, 1965, Ser. No. 512,975
5 Claims. (Cl. 148—187)

ABSTRACT OF THE DISCLOSURE

A method of forming a tapered PN junction in a wafer of semiconductor material comprises the steps of: (1) depositing a tapered layer of a doped oxide of a semiconductor from the vapor state, through an apertured mask, onto a portion of the wafer, said tapered layer being deposited so that it only partially fills the aperture of said mask, and (2) heating the layer and the wafer to diffuse a portion of the dopant from the layer into the wafer. If the layer and the wafer are of opposite type conductivities, a tapered PN junction is formed in the wafer.

This invention relates generally to methods used in the manufacture of semiconductor devices, and more particularly to improved methods of forming improved PN junctions.

In the prior art, certain devices are fabricated by diffusing a dopant into a semiconductor body through a plane surface thereof. In making such devices, it has been proposed to diffuse a suitable gaseous dopant through the surface of the substrate or to diffuse the dopant into the substrate from a doped layer of material of uniform thickness adjacent to the substrate. While such prior-art methods of forming a rectifying junction are satisfactory for many applications, the rectifying junction so formed may have portions whose radii of curvature are relatively small, thereby providing portions where the rectifying junction may tend to breakdown with a slight excess in the rated, reverse-bias breakdown voltage. Also, the width of the depletion region of such a prior art rectifying junction at the surface of the semiconductor substrate, when the rectifying junction is back biased, is relatively small because the ends of the PN junction are substantially perpendicular to the surface through which the PN junction is formed. Such a structure tends to concentrate the surface space charge when the rectifying junction is back-biased, a condition conducive to a breakdown of the rectifying junction with a slight excess in the reverse-bias voltage.

An object of the present invention is to provide an improved method of forming a diffused doped region of tapered form in a semiconductor body.

A further object of the present invention is to provide an improved method of forming a rectifying junction with improved reverse-bias breakdown voltage characteristics.

As used herein a tapered junction is one which intersects a planar surface of a semiconductor body at an acute angle.

Briefly, the improved method comprises depositing a quantity of a doped oxide, from a vapor state in a chamber, onto a portion of a substrate, through an apertured mask adjacent to the substrate. The area of any aperture in the mask is relatively much smaller than that of a cross-section of the chamber immediately above, and parallel to, the mask. The ratio of the mask thickness to the aperture diameter should be 1/10 or larger. The quantity of oxide so deposited is thereby tapered, i.e., it is thicker at its center than at its peripheral edge. The doped deposit and the substrate are then heated to diffuse a quantity of the dopant from the deposit into the substrate to form a tapered, diffused doped region in the substrate.

Figures 5, 6:
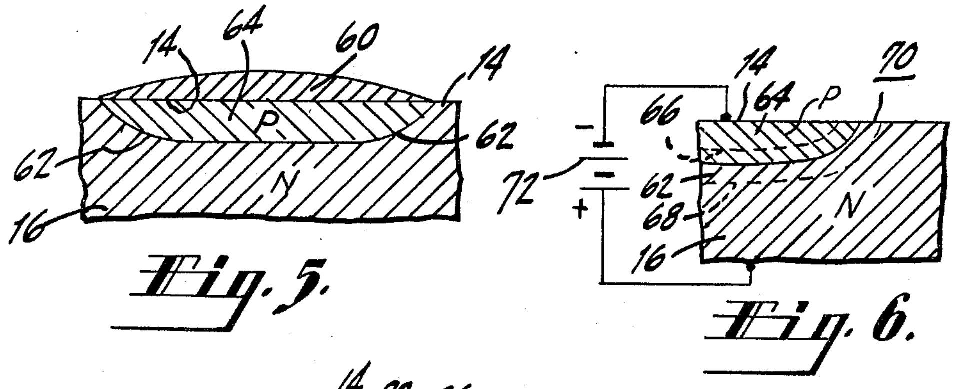
FIG. 5 is an enlarged, fragmentary, cross-sectional view of a tapered, doped oxide on a substrate of semiconductor material, showing a tapered, diffused doped region in the substrate formed by the improved method.
Figure 7:
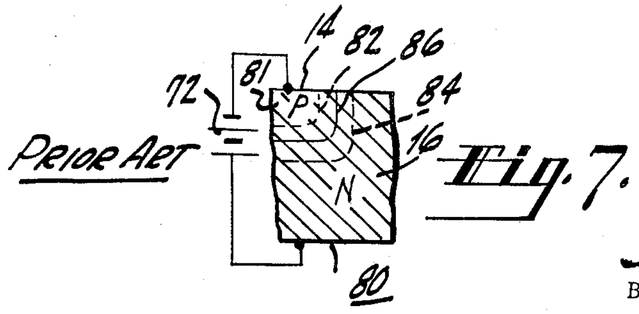

FIG. 6 is an enlarged, fragmentary, cross-sectional view of a planar diode of the type formed by the improved methods, showing, schematically, a PN junction back biased by a voltage source, a depletion region being illustrated by dashed lines on opposite sides of the PN junction; and FIG. 7 is an enlarged, fragmentary, cross-sectional view of a back-biased, prior-art, planar diode, illustrating its depletion region between dashed lines on opposite sides of its PN junction.

Figures 1, 2, 3:
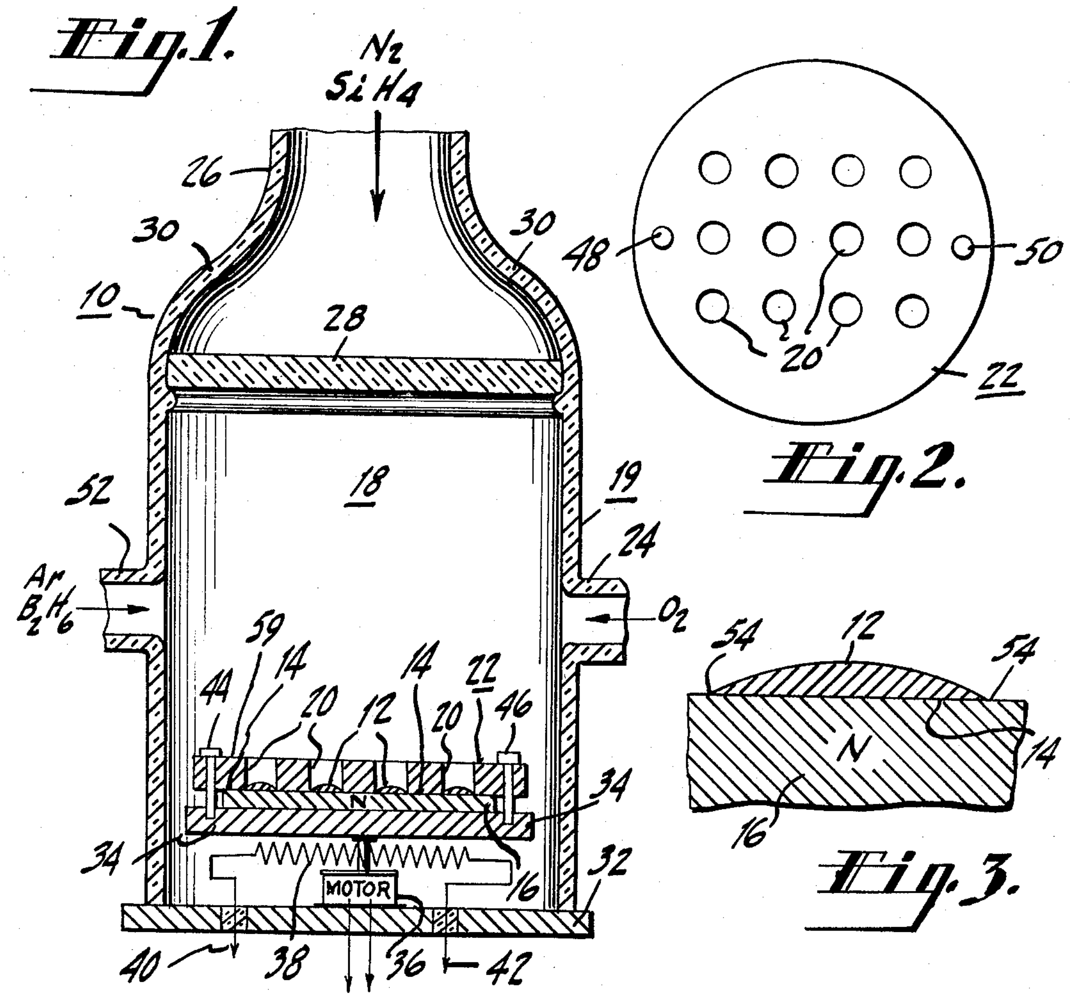
FIG. 1 is a cross-sectional view of apparatus, partially schematic, for carrying out the improved method of forming a tapered junction.
FIG. 2 is a plan view of an apertured mask used in the apparatus shown in FIG. 1.
FIG. 3 is an enlarged, fragmentary, cross-sectional view of a tapered oxide deposit on a substrate, as formed by the apparatus shown in FIGS. 1 and 2.

Referring now particularly to FIG. 1, there is shown apparatus 10 for forming tapered oxide deposits 12 on the surface 14 of a substrate 16. The deposits 12 are formed from a vapor state of reaction products in a chamber 18 of a bell-type container 19 and are deposited on the substrate 16 through apertures 20 in a mask 22.

The tapered oxide deposits 12, shown in an enlarged cross-section in FIG. 3, can comprise either silicon dioxide or germanium oxide on the surface 14 of the substrate 16. The substrate 16 is preferably a wafer of semiconductor material of either N type or P type conductivity.

The tapered oxide deposits 12 are formed by the deposition of reaction products resulting from the combination of oxygen ($O_2$) and silane ($SiH_4$) or germane ($GeH_4$) in the chamber 18. The oxygen is fed into the chamber 18 through a port 24 in the container 19. The flow rate of the oxygen can be controlled by any means known in the art. The silane or germane is fed into the chamber 18 through both a port 26 and a glass frit plate 28 disposed across the chamber 18, by any suitable means, at the shoulders 30 of the container 19. The frit plate 28 serves both as a filter and as a diffusion means to distribute the silane or germane evenly throughout the chamber 18 and to provide a vapor state of reaction products that substantially fill the chamber 18 when the silane or germane reacts with oxygen.

The container 19 rests on a flat base 32. The substrate 16 rests on a rotary platform 34 of metal, such as stainless steel. The platform 34 is coupled to a motor 36 for rotation thereby when the motor is energized. A heater 38, illustrated as a resistor, is disposed beneath the platform 34 for heating the latter. The heater 38 is adapted to be energized from any suitable source of electrical energy applied to a pair of the heater's terminals 40 and 42. The mask 22 may be fixed to the platform 34 by screws 44 and 46 that pass through holes 48 and 50 (FIG. 2), respectively, in the mask 22.

The container 19 is also formed with an inlet port 52 that communicates with the chamber 18 for introducing a controlled flow of a dopant into the chamber 18 for the purpose hereinafter appearing.

The method of depositing tapered oxide deposits 12 on portions of the surface 14 of the substrate 16, exposed by the openings 20 of the mask 22, will now be explained: A mixture of silane ($SiH_4$) and an inert gas, such as argon or nitrogen, is introduced into the chamber 18 through the port 26. The silane should comprise 1–3%, by weight, of the mixture. Oxygen ($O_2$) is introduced into the chamber 18 through the port 24. If a dopant is not desired in the tapered oxide deposit 12, the port 52 is closed by any suitable means (not shown).

The platform 34 is rotated by the motor 36 and heated to a temperature of between 150° C. and 400° C. by the heater 38. By passing through the frit plate 28, the silane is dispersed evenly in the chamber 18 where it reacts with the oxygen to form reaction products in a vapor state:

$$SiH_4+2O_2 \rightarrow SiO_2+2H_2O$$

The silicon dioxide ($SiO_2$) settles out from the vapor state and is deposited onto the heated substrate 16 through the apertures 20 in the mask 22. The oxide deposits 12 so formed are amorphous because of the heat supplied by the heater 38. When cooled, the deposits 12 are solid and have a tapered form, as illustrated in the enlarged cross-sectional view of the deposit 12 in FIG. 3. The deposit 12 is thicker at its center than at its peripheral edge 54, tapering progressively narrower from its center to its peripheral edge 54.

A deposit 12 of silicon dioxide, having a diameter of about 25 mils and a thickness of about 4,000 A. at its center, was formed on a substrate 16 covered with a mask 22 having a thickness of about 15 mils and aperture diameters of 25 mils. A 3% mixture of silane in nitrogen was introduced into the container 19 at a rate of about 2.4 liters/min., and oxygen was introduced into the container 19 at a rate of about 60 cc./min. The temperature of the platform was maintained at about 200° C. The deposit 12, having a thickness of about 4,000 A., was formed in about 10 minutes. The temperatures, flow rates, and dimensions given herein are not critical; they are merely illustrative and are not to be construed in a limiting sense.

Germane ($GeH_4$) may be substituted for silane in the aforementioned embodiment of the improved methods to form deposits 12 of $GeO_2$:

$$GeH_4+2O_2 \rightarrow GeO_2+2H_2O$$

The reaction product germanium oxide ($GeO_2$) settles out on the heated substrate 16 to form the tapered oxide deposits 12.

Figure 4:
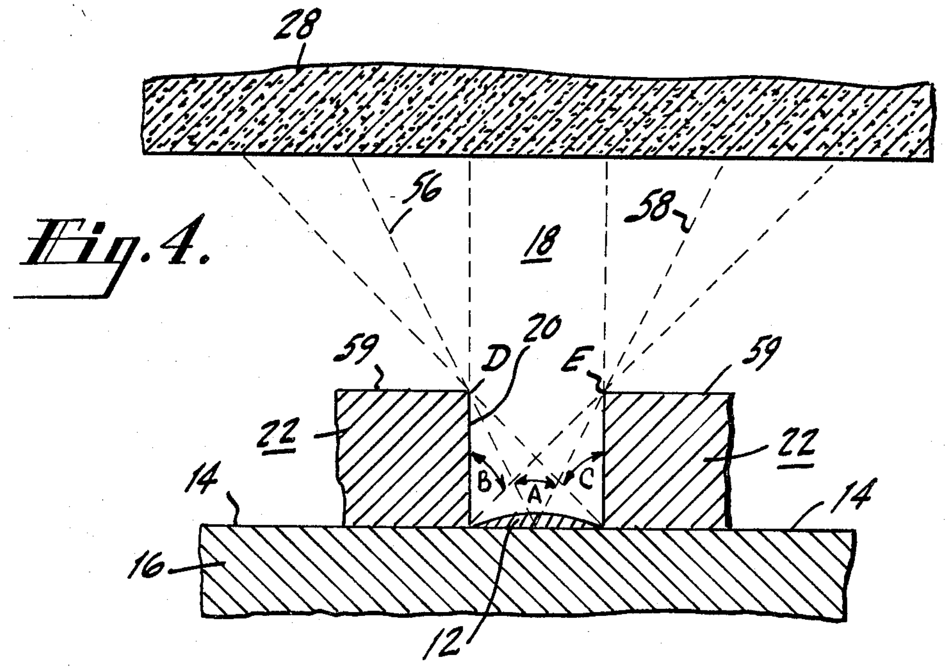
FIG. 4 is an enlarged, fragmentary, cross-sectional view of a portion of the apparatus shown in FIG. 1 to explain the formation of tapered oxide deposits by the improved methods.

Referring now to FIG. 4, there is shown an enlarged, cross-sectional view of the mask 22 on the substrate 16 in the chamber 18 for explaining the formation of the tapered deposits 12. The cross-section of the mask 22, in FIG. 4 is along a diameter of one of the openings 20. The walls of the mask 22 that define the openings 20 are assumed to be perpendicular to the surface 14 of the substrate 16. It can be shown structurally, that an angle A, whose vertex is at the point on the surface 14 in the center of the opening 20 (FIG. 4) and whose sides 56 and 58 include diametrically opposite points D and E, respectively, on the remote surface 59 of the mask 22 at the edge of the opening 20, is greater than any other angle whose vertex is also on the surface 14 and whose sides also include the points D and E, such as angles B and C, for example. The vertices of the angles B and C are diametrically opposite each other, and each angle has a side in the wall that defines the opening 20. Since particles of the reaction products in the chamber 18 settle onto the substrate 16 from any direction, and from a source wider than the opening 20, that is, the area of an opening 20 coplanar with the surface 14, more of the reaction products settle out in the center (vertex of the larger angle A) of the opening 20 than elsewhere in the opening 20, resulting in the tapered deposit 12.

The thickness of the mask 22, the area of the aperture 20 (parallel to the surface 14), and the cross-sectional area of the chamber 18 (parallel to the mask 22) will determine the contour of the tapered oxide deposit 12. For practical purposes, the thickness of the mask 22 should be in the range between 1 mil and 50 mils, and the average diameter of an aperture 20 should be in the range between 1 mil and 500 mils. The ratio of the mask thickness to the aperture diameter should be 1/10 or greater. For example, if the mask 22 is 10 mils thick, the diameter of the aperture 20 should not be greater than 100 mils. In general, the oxide deposit 12 will be tapered if the cross-sectional area of the vapor state of the oxide is greater than the area of an aperture 20.

The tapered oxide deposit 12 can be doped with a suitable dopant to provide a tapered, doped oxide deposit 60 as shown in FIG. 5. The doped deposit 60 is similar to the deposit 12 except for a suitable dopant contained in the deposit 60. The doped deposit 60 can be used for forming an improved PN junction 62 and a doped diffusion region 64 in the semiconductor substrate 16 in a manner hereinafter to be explained.

The doped deposit 60 is deposited on the substrate 16 in substantially the same manner as described for the tapered deposit 12, except that the doped deposit 60 is formed from a vapor state including the presence of a suitable dopant in the chamber 18. To form the deposit 60, a dopant such as diborane ($B_2H_6$), 1% $B_2H_6$, by weight, in an inert gas such as argon or nitrogen, is introduced into the chamber 18 through the port 52, along with the oxygen from the port 24 and the silane from the port 26. A reaction takes place in the chamber 18 resulting in reaction products in a vapor state. The deposits 60 that settle onto the surface 14 of the substrate 16, through the holes 20 and the mask 22, are found to be deposits of silicon dioxide doped with boron, an acceptor impurity, that is, a P type conductivity-inducing impurity. If a donor impurity, that is, an N type conductivity-inducing impurity, such as phosphene ($PH_3$) were used intead of diborane, the doped deposit 60 would be of N type conductivity.

If the tapered deposit 60 of doped oxide is heated to a temperature of about 1150° C., the dopant in the deposit 60 diffuses through the surface 14 of the substrate 16 and forms the tapered diffused region 64 of the dopant in the substrate 16. For example, referring to FIG. 5, heating the deposit 60 of silicon dioxide doped with boron to a temperature of 1150° C. for about 30 minutes causes the boron to diffuse into the substrate 16 to form the PN junction 62, assuming the substrate 16 is of N type semiconductor material. Since, the deposit 60 is tapered in form, the diffused region 64, directly beneath the deposit 60 will also be tapered in form, being thicker at its center and becoming successively narrower toward its peripheral edge at the surface 14 of the substrate 16. This follows from the fact that there is more dopant in the thicker center portion of the deposit 60 than there is at its peripheral portion.

Referring now to FIG. 6, there is shown a back-biased, planar diode 70 that has a PN junction 62 formed by the operations described for the formation of the PN junction 62 illustrated in FIG. 5. The diode 70 is back-biased by a voltage source 72, and the width of the depletion region is indicated by dashed lines 66 and 68 on the opposite sides of the PN junction 62, respectively. Since the diffused P type region 64 in the diode 70 is tapered toward its peripheral edge, the PN junction 62 approaches the upper surface 14 of the substrate 16 at an acute angle, rather than substantially perpendicularly as in many prior-art planar diodes. Because of the tapered shape of the diffused region 64, the width of the depletion region along the surface 14 is wider than it would be if the PN junction approached the surface 14 at a right angle. This structure distributes the surface space charge of the diode 70, when back-biased, over a wider area than in prior-art diodes, providing the diode 70 with improved reverse-bias, breakdown voltage characteristics.

Referring now to FIG. 7, there is shown a back-biased, planar diode 80 formed by prior-art methods, as by forming a P type region 81 in the N type substrate 16 by diffusing a gas through the surface 14 of the substrate 16. The diode 80 is back-biased by the voltage source 72, and a depletion region, defined by dashed lines 82 and 84 on opposite sides of its PN junction 86, respectively, is formed. The PN junction 86, formed by many prior-art methods, approaches the surface 14 at substantially a right angle. If it is assumed that the width of the depletion region about the PN junction is the same in the prior art diode 80 as it is in the diode 70 it is apparent that the length of the depletion region along the surface 14 of the diode 80 is shorter than it is along the surface 14 of the diode 70. Hence, for a given back-bias voltage from the voltage source 72, the distribution of the surface space charge along the surface 14 (between the lines 66 and 68) of the improved diode 70 is over a wider area than it is along the surface 14 of the prior art diode 80 (between the lines 82 and 84). This greater distribution of the surface space charge of the back-biased diode 70 decreases its tendency to breakdown along the surface and provides the diode with an improved voltage breakdown characteristic.

What is claimed is:

1. A method of forming a diffused region of tapered shape beneath a portion of a surface of a substrate of semiconductor material, said method comprising:

depositing a tapered layer of a doped oxide of a semiconductor, from a vapor state of said oxide and a semiconductor dopant in a chamber, onto said portion of said surface through an aperture of a mask removably disposed against said surface, said portion being exposed by said aperture, the area of said portion being substantially smaller than that of a cross-section of said chamber immediately above said mask and parallel to said portion, said mask having a thickness to aperture diameter ratio of 1/10 or greater, and said tapered layer being deposited so that it only partially fills said aperture, whereby the center portion of the deposited tapered layer is thicker than the peripheral portion thereof, and heating said substrate and said doped oxide to diffuse some of said dopant from said tapered layer of doped oxide through said portion and into said substrate, whereby to form said diffused region.

2. A method of forming a diffused region of tapered shape beneath a portion of a surface on a substrate of semiconductor material, as defined in claim 1, wherein said oxide is one of silicon or germanium.

3. A method of forming a diffused region of tapered shape beneath a portion of a surface of a substrate of a semiconductor material, as defined in claim 1, wherein said oxide is the reaction product of oxygen and silane or germane, said semiconductor material is of one type conductivity, and said dopant is an opposite type conductivity-inducing impurity.

4. A method of forming a diffused region of tapered shape beneath a portion of a surface of a substrate of semiconductor material, as defined in claim 1, wherein said semiconductor material is of one type conductivity, said oxide is the reaction product of silane and oxygen, and said semiconductor dopant is of an opposite type conductivity-inducing impurity.

5. A method of forming a diffused region of tapered shape beneath a portion of a surface of a substrate of semiconductor material, as defined in claim 1, wherein said semiconductor material is of one type conductivity, said oxide is one of silicon or germanium, said dopant is an opposite type conductivity-inducing impurity, and said substrate is heated between 150° C. and 400° C. during the step of depositing said quantity of doped oxide.

References Cited

UNITED STATES PATENTS

| | | | |
|---|---|---|---|
| 2,861,229 | 11/1958 | Pankove | 148—188 XR |
| 2,931,743 | 4/1960 | Rittman | 148—179 |
| 3,055,776 | 9/1962 | Stevenson | 148—187 XR |
| 3,144,366 | 8/1964 | Rideout | 148—179 |
| 3,151,008 | 9/1964 | Sprague | 148—179 |
| 3,183,129 | 5/1965 | Tripp | 148—187 XR |
| 3,183,128 | 5/1965 | Leistiko et al. | 148—187 XR |
| 3,200,019 | 8/1965 | Scott et al. | 148—188 |

HYLAND BIZOT, *Primary Examiner.*